(12) United States Patent
Lin et al.

(10) Patent No.: US 10,985,145 B1
(45) Date of Patent: Apr. 20, 2021

(54) LIGHT SOURCE MODULE

(71) Applicant: Coretronic Corporation, Hsin-Chu (TW)

(72) Inventors: Shih-Yi Lin, Hsin-Chu (TW); Wen-Hsun Yang, Hsin-Chu (TW); Yu-An Huang, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/734,420

(22) Filed: Jan. 6, 2020

(51) Int. Cl.
| | |
|---|---|
| *H01L 25/075* | (2006.01) |
| *H01L 33/60* | (2010.01) |
| *H01L 33/54* | (2010.01) |
| *F21V 8/00* | (2006.01) |

(52) U.S. Cl.
CPC ........ *H01L 25/0753* (2013.01); *G02B 6/0036* (2013.01); *H01L 33/54* (2013.01); *H01L 33/60* (2013.01)

(58) Field of Classification Search
CPC ..... H01L 25/0753; H01L 33/60; H01L 33/54; G02B 6/0038; G02B 6/0021; G02B 6/0018; G02B 6/0055; G02B 6/0068; G02B 6/0036
See application file for complete search history.

(56) References Cited

U.S. PATENT DOCUMENTS

| | | | |
|---|---|---|---|
| 8,641,219 B1 * | 2/2014 | Johnson | G02B 6/0021 |
| | | | 362/97.3 |
| 2019/0324184 A1 | 10/2019 | Cai et al. | |
| 2020/0209458 A1 * | 7/2020 | Yuu | H01L 33/505 |

FOREIGN PATENT DOCUMENTS

| | | | | |
|---|---|---|---|---|
| TW | 201506317 | | 2/2015 | |
| WO | WO-2013005542 A1 * | | 1/2013 | G02B 6/0016 |

* cited by examiner

*Primary Examiner* — Marcos D. Pizarro
*Assistant Examiner* — Antonio B Crite
(74) *Attorney, Agent, or Firm* — JCIPRNET

(57) ABSTRACT

A light source module including a substrate and a plurality of light emitting units is provided. The light emitting units are disposed on a surface of the substrate and each light emitting unit includes a first light emitting device, a second light emitting device, a first reflective element, a second reflective element and a package structure. The first reflective element and the second reflective element are respectively overlapped with the first light emitting device and the second light emitting device along a direction being perpendicular to the surface of the substrate. The package structure is disposed between the first reflective element, the second reflective element, the first light emitting device and the second light emitting device. The package structure includes a main body portion and a first recess. The main body portion covers the first light emitting device and the second light emitting device.

13 Claims, 10 Drawing Sheets

LIGHT SOURCE MODULE

BACKGROUND

Technical Field

The invention relates to a backlight module, and particularly relates to a light source module.

Description of Related Art

With the increasing application of non-emissive displays such as a liquid crystal display, the design of backlight modules also needs to be adjusted for different applications. In order to meet the display requirement of large size, high dynamic range (HDR) and high contrast, the backlight module needs to have the function of local dimming. Therefore, direct-lit type backlight modules using light emitting diodes as the main light source have gradually become the mainstream in the market. Because the overall thickness of such backlight modules is thin (for example, the optical distance is less than 10 mm), the light emitting diodes are usually covered with a encapsulation layer having a light exiting structure to achieve a more uniform light emitting effect on the light exiting surface of the backlight module. However, during the transmission of a part of the light emitted from a light emitting diode in the encapsulation layer, it may also be transmitted laterally from a predetermined light exiting region to a light exiting region dominated by another light emitting diode through multiple total reflections within the encapsulation layer. Accordingly, a halo effect will occur around the light exiting region of the light emitting diode, which causes the edges of the displayed image to be blurred, resulting in a decrease in overall display quality (for example, display contrast). Therefore, how to improve the uniformity of light output of the ultra-thin direct-lit type backlight module has become an important subject for the related manufactures.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY

The invention provides a light source module with favorable uniformity of light emission and considerable latitude of process.

Other features and advantages of the invention can be further understood by the technical features disclosed in the invention.

To achieve one, part, or all of the objectives aforementioned or other objectives, an embodiment of the invention provides a light source module. The light source module includes a substrate and a plurality of light emitting units. The light emitting units are disposed on a surface of the substrate and each light emitting unit includes a first light emitting device, a second light emitting device, a first reflective element, a second reflective element and a package structure. The first reflective element and the second reflective element are respectively overlapped with the first light emitting device and the second light emitting device along a direction being perpendicular to the surface of the substrate. The package structure is disposed between the first reflective element, the second reflective element, the first light emitting device and the second light emitting device. The package structure includes a main body portion and a first recess. The main body portion covers the first light emitting device and the second light emitting device. The first recess has a central position. A depth of the first recess decreases toward all directions away from the central position.

In view of the above, the embodiments of the invention have at least one of the following advantages or effects. In the light source module according to an embodiment of the invention, a package structure of a light emitting unit is disposed between light emitting devices and reflective elements. At least two light emitting devices are covered by a main body portion of the package structure so that the manufacturing tolerance of the package structures can be increased. In addition, a first recess of the package structure having a central position is positioned between the light emitting devices and its depth decreases toward all directions away from the central position. Accordingly, the light emitted by a light emitting device can be prevented from being transmitted laterally from a predetermined light exiting region to another light exiting region overlapped with another package structure so as to inhibit the halo effect occurring around the edge of light exiting region. In other words, the uniformity of the light output of the light source module can be improved.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
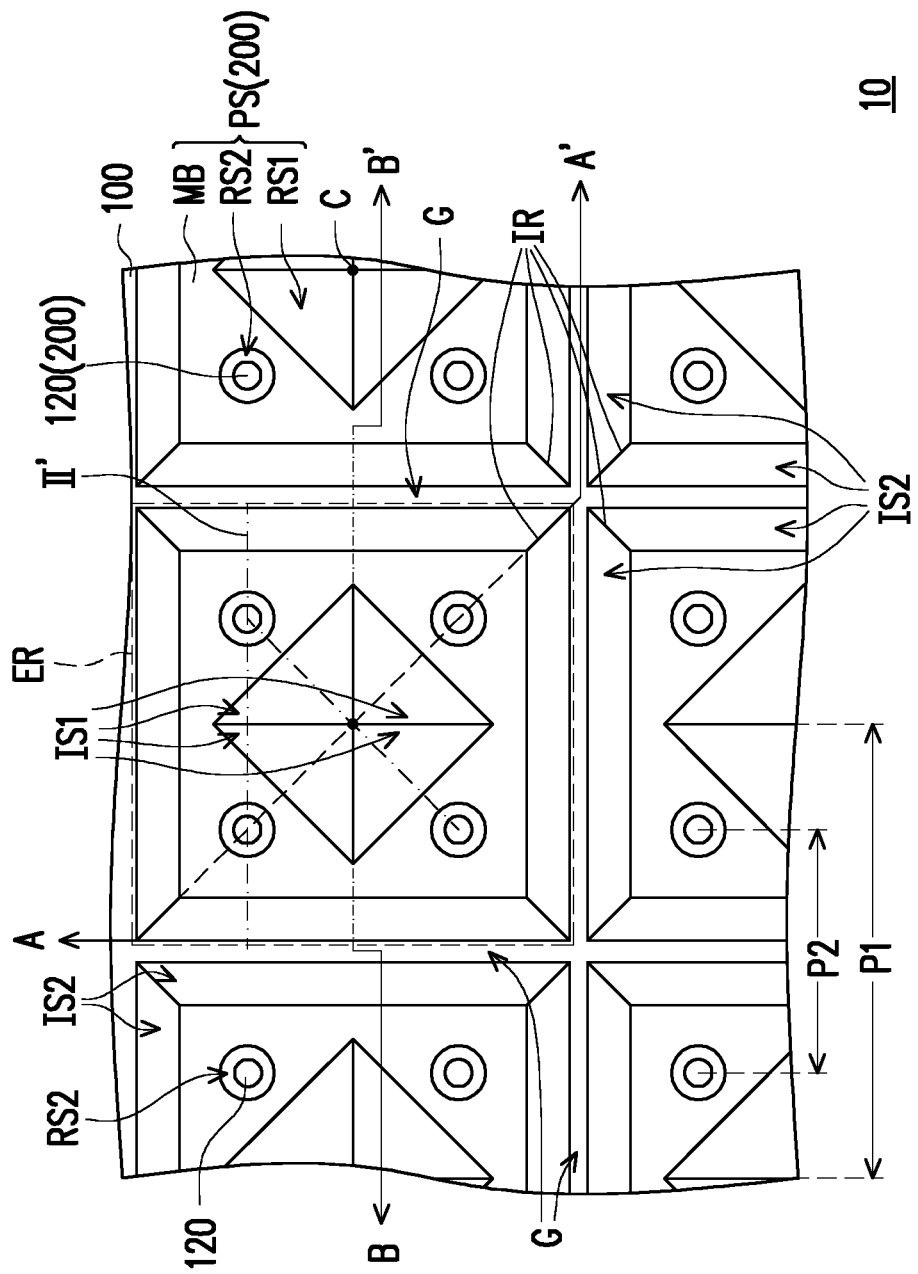
FIG. 1 is a schematic top view of a light source module according to a first embodiment of the invention.
Figure 2:
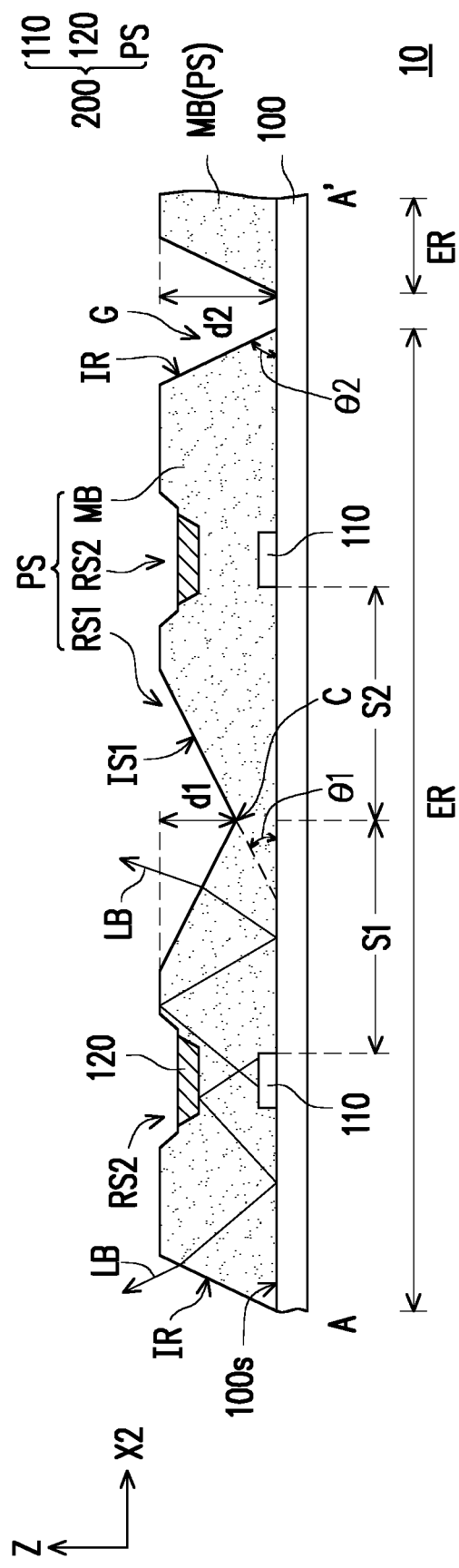
FIG. 2 is a schematic cross-sectional view of a light source module of FIG. 1 corresponding to a section line A-A'.
Figure 3:
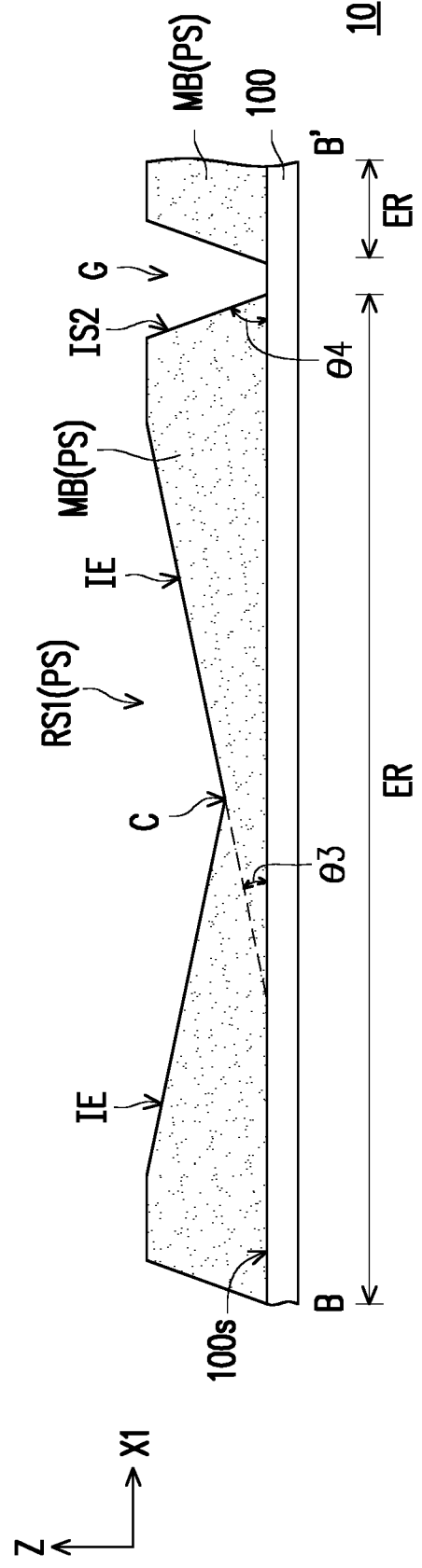
FIG. 3 is a schematic cross-sectional view of a light source module of FIG. 1 corresponding to a section line B-B'.
Figure 4:
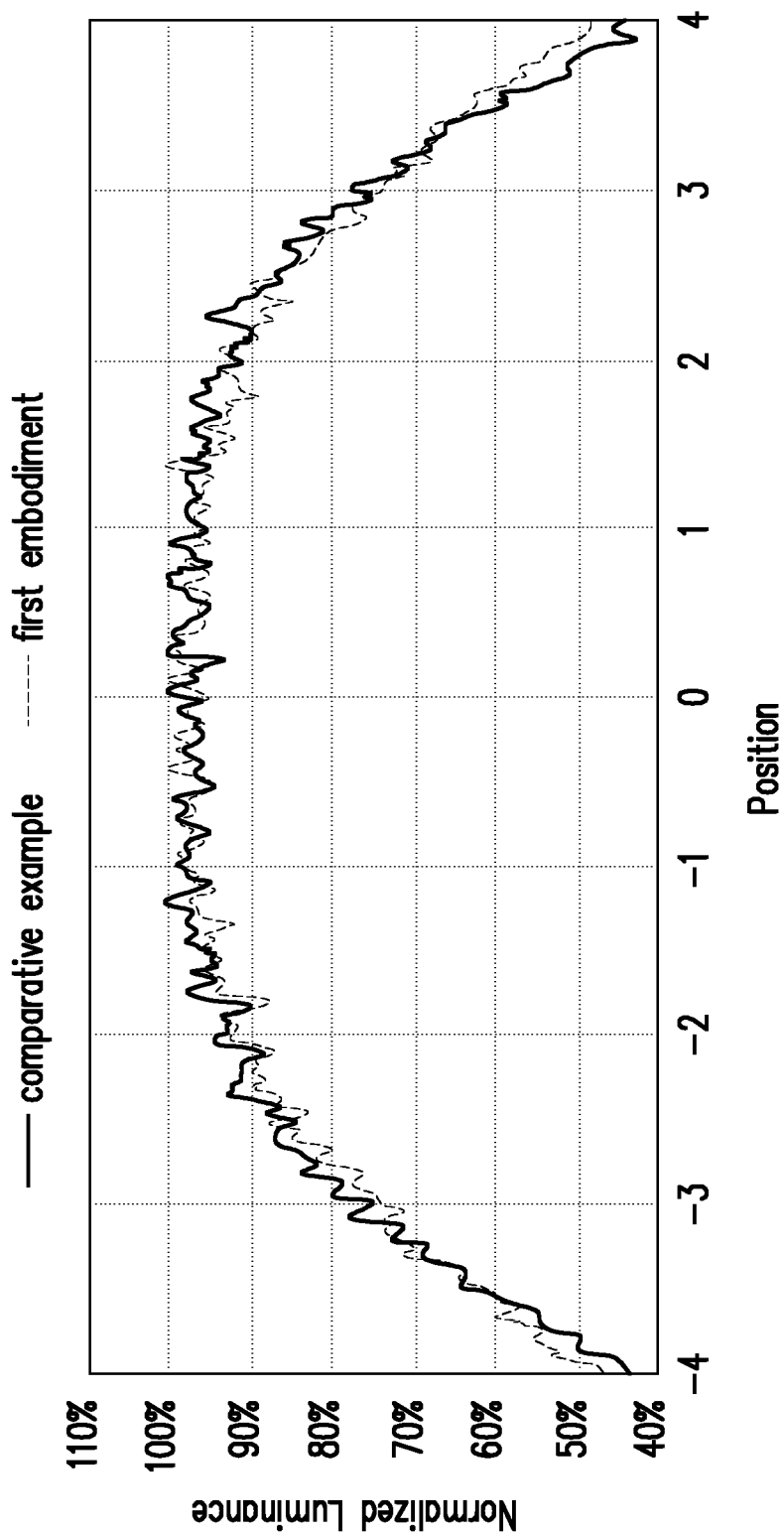
FIG. 4 is a graph of normalized luminance versus position of a light source module of FIG. 1 corresponding to a section line B-B'.
Figure 5:
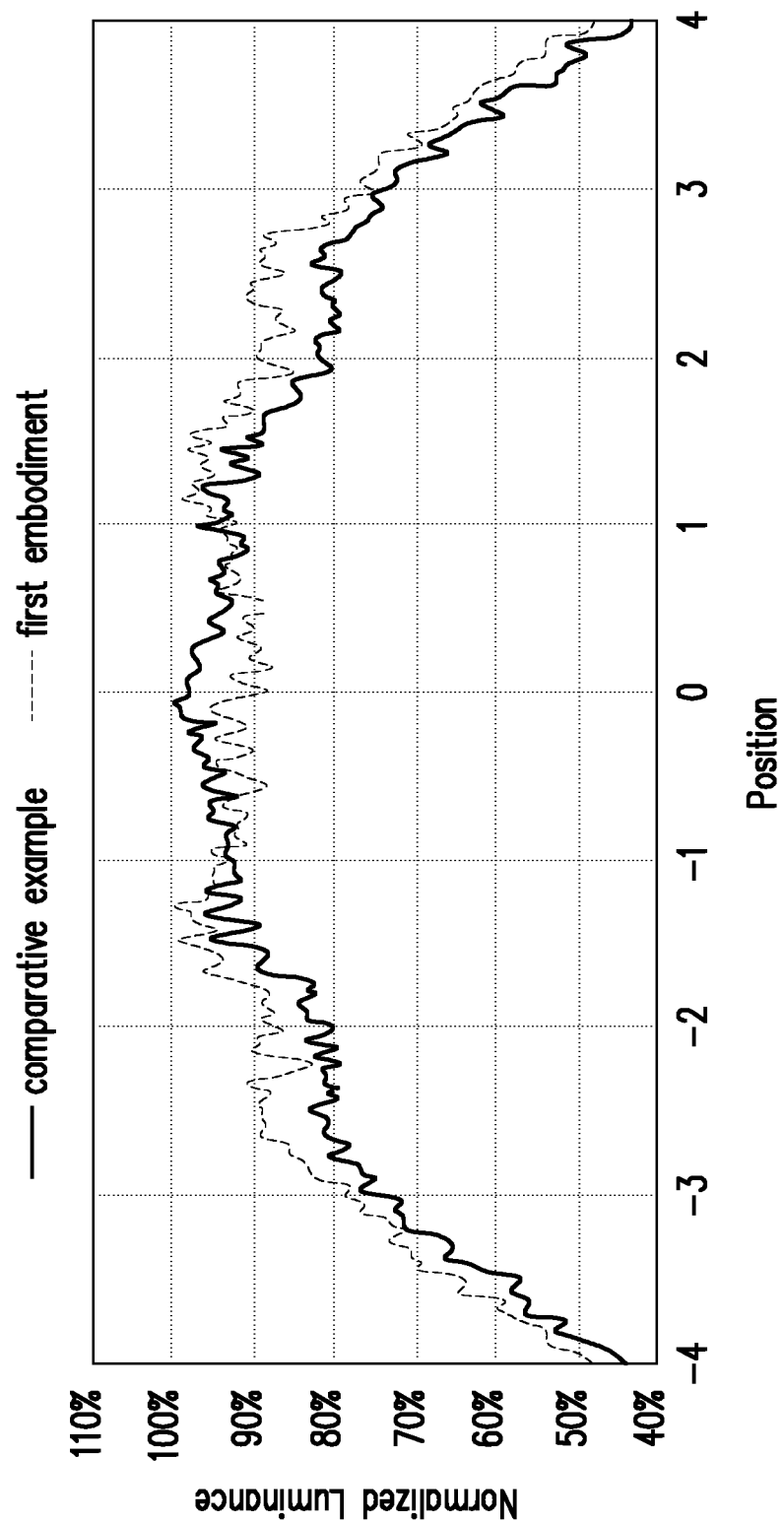
FIG. 5 is a graph of normalized luminance versus position of a light source module of FIG. 1 corresponding to a path II'.
Figure 6:
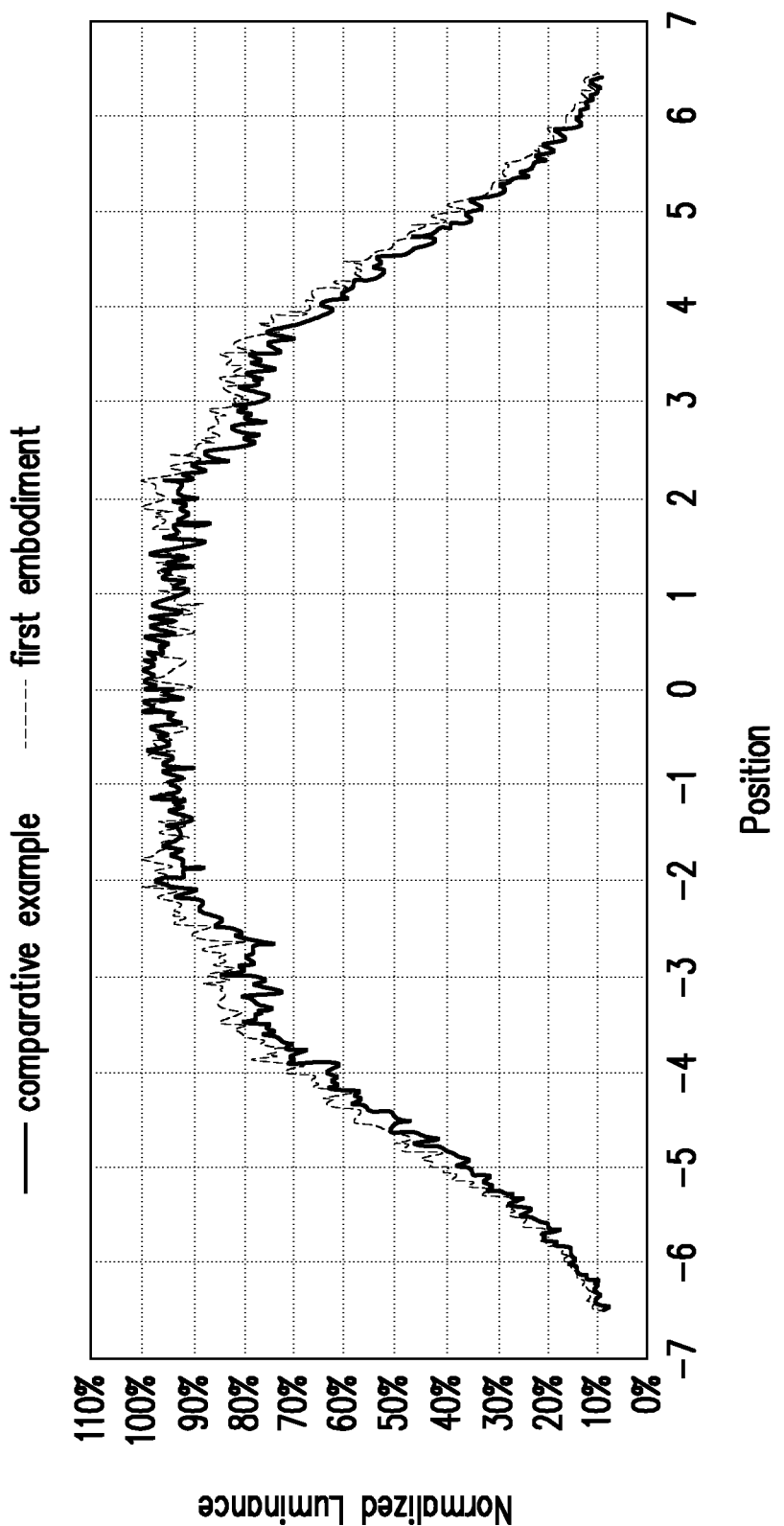
FIG. 6 is a graph of normalized luminance versus position of a light source module of FIG. 1 corresponding to a section line A-A'.
Figure 7:
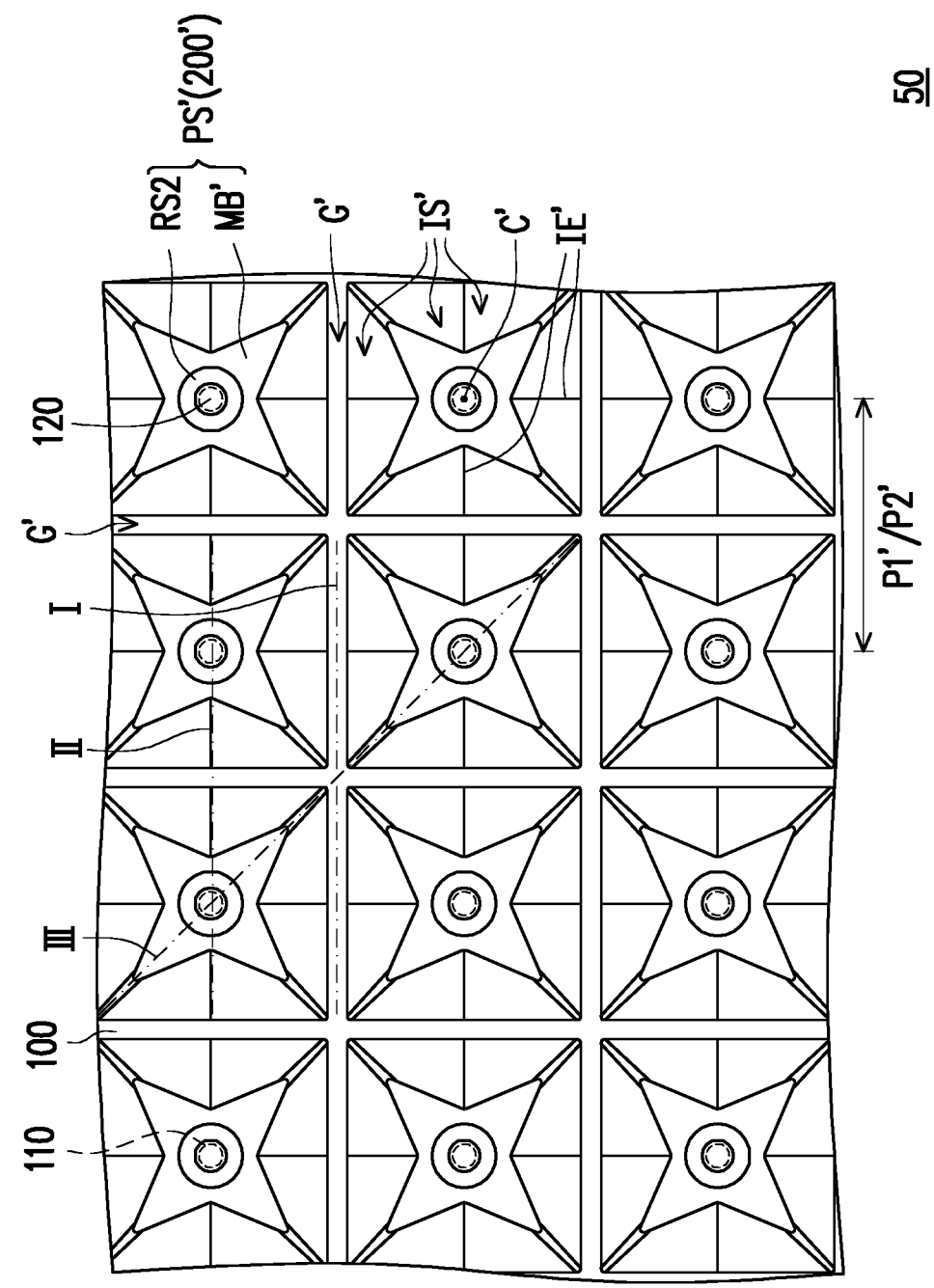
FIG. 7 is a schematic top view of a comparative example of light source module.

FIG. 1 is a schematic top view of a light source module according to a first embodiment of the invention. FIG. 2 is schematic cross-sectional view of a light source module of FIG. 1 corresponding to the section line A-A'. FIG. 3 is a schematic cross-sectional view of a light source module of FIG. 1 corresponding to section line B-B'. FIG. 4 is a graph of normalized luminance versus position of a light source module of FIG. 1 corresponding to a section line B-B'. FIG. 5 is a graph of normalized luminance versus position of a light source module of FIG. 1 corresponding to a path II'. FIG. 6 is a graph of normalized luminance versus position of a light source module of FIG. 1 corresponding to a section line A-A'. FIG. 7 is a schematic top view of a comparative example of light source module.

Referring to FIG. 1, FIG. 2 and FIG. 3, a light source module 10 includes a substrate 100 and a plurality of light emitting units 200. The light emitting units 200 are disposed on a surface 100s of the substrate 100. Each light emitting unit 200 includes a plurality of light emitting devices 110, a plurality of reflective elements 120 and a package structure PS. The package structure PS is disposed between the light emitting devices 120 and the reflective elements 120. The reflective elements 120 are respectively overlapped with the light emitting devices 110 along a direction (i.e., the direction Z) being perpendicular to the surface 100s of the substrate 100. It is to be particularly noted that, orthogonal projections of the package structures PS on the surface 100s of the substrate 100 may define a plurality of light exiting regions ER of the light source module 10 separate to each other. The section line A-A' of FIG. 2 represents the diagonal of the light emitting unit 200.

In the present embodiment, the light emitting devices 110 and the light emitting units 200 (or the package structures PS) are respectively arranged on the surface 100s of the substrate 100 in an array. In detail, the light emitting units 200 are arranged with a first interval P1 along the direction X1. The light emitting devices 110 are arranged with a second interval P2 along the direction X1. The ratio of the first interval P1 to the second interval P2 is an integer being larger than 1. In the present embodiment, the ratio of the first interval P1 to the second interval P2, for example, is 2, but the invention is not limited thereto. Similarly, in the present embodiment, the light emitting units 200 may be arranged with the first interval P1 (not shown in FIG. 1) along a direction Y1 and the light emitting devices 110 may be arranged with the second interval P2 (not shown in FIG. 1) along the direction Y1. The direction Y1 intersects the direction X1 (for example, the direction Y1 may be perpendicular to the direction X1). However, the invention is not limited thereto. In other embodiments, the interval between any two adjacent light emitting units 200 arranged along the direction X1 may also be different from the interval between any two adjacent light emitting units 200 arranged along the direction Y1. The interval between any two adjacent light emitting devices 110 arranged along the direction X1 may also be different from the interval between any two adjacent light emitting devices 110 arranged along the direction Y1.

On the other hand, each package structure PS includes a main body portion MB and a first recess RS1. The main body portions BM cover the light emitting devices 110. In the present embodiment, four light emitting devices 110, for example, are included in each light emitting unit 200 and covered by the main body portion MB. The first recess RS1 of a package structure PS of a light emitting unit 200 is positioned between any two of the light emitting devices 110 (or the reflective elements 120) of the light emitting unit 200 and not overlapped with these four light emitting devices (or the reflective elements 120) along the direction Z.

Specifically, the first recess RS1 has a central position C. A connecting line CL connects two orthogonal projections of two light emitting devices 110 of the light emitting unit 200 respectively disposed on two opposite sides of the first recess RS1 on the surface 100s of the substrate 100, which passes through an orthogonal projection of the central position C on the surface 100s of the substrate 100. A distance S1 between two orthogonal projections of one of the light emitting devices 110 and the central position C of the first recess RS1 on the surface 100s of the substrate 100 is equal to a distance S2 between two orthogonal projections of another one of the light emitting devices 110 and the central position C of the first recess RS1 on the surface 100s of the substrate 100. In other words, these four light emitting devices 110 covered by the same main body portion MB are arranged around the central position C in a symmetrical distribution manner. Accordingly, the amount of light emitted from the first recess RS1 can be uniformly derived from the four light emitting devices 110 so as to improve the uniformity of the light output of the light source module 10.

The package structure PS further includes a plurality of second recesses RS2. The second recesses RS2 of the package structures PS are overlapped with the light emitting devices 110 along a direction perpendicular to the surface 100s of the substrate 100 (i.e., the direction Z). The reflective elements 120 are respectively disposed in the second recesses RS2. For example, the reflective element 120 may contain multiple reflective particles (not illustrated), and the material of the reflective particles includes metal, silicon oxide, titanium dioxide, or a combination thereof, but the invention is not limited thereto. It is to be particularly mentioned that, the light emitted by the light emitting device 110 can be transmitted laterally in the main body portion MB through the reflection of the reflective element 120, so as to improve the uniformity of the light output of the light source module 10.

It is to be explained that, in the present embodiment, the number of the light emitting device 110 and reflective element 120 is exemplarily illustrated for the purpose of explanation, and the invention is not limited thereto. For example, in some embodiments, the number of the light emitting device 110 covered by a main body portion MB may selectively be 2, 3 or an integer being larger than 4. In other words, at least two light emitting devices 110 are covered by each main body portion MB.

Furthermore, the light source module 10 further includes a plurality of grooves G disposed between the package structures PS of the light emitting units 200. In the present embodiment, orthogonal projections of the first recesses RS1 on the surface 100s of the substrate 100 are separated from orthogonal projections of the grooves G on the surface 100s of the substrate 100. However, the invention is not limited thereto. In other embodiments, the orthogonal projections of the first recesses RS1 on the surface 100s of the substrate 100 may connect the orthogonal projection of the grooves G on the surface 100s of the substrate 100.

Specifically, the main body portions MB of the package structures PS are arranged on the surface 100s of the substrate 100 in an array. For example, the grooves G and the main body portions MB may be alternately arranged in the direction X1 and the direction Y1, but the invention is not limited thereto. In some embodiments, the grooves G and the main body portions MB may also be alternately arranged in another direction, for example, the main body portions MB are arranged on the surface 100s of the substrate 100 in a honeycomb arrangement. From another point of view, the grooves G can define the package structures PS (or the light emitting regions ER) and group the light emitting devices 110 of the light source module 10. It is worth mentioned that, the configuration of the grooves G is conducive to prevent the light LB emitted by a light emitting device 110 from being transmitted laterally from a predetermined light exiting region ER to another light exiting region ER overlapped with another package structure PS. As such, the halo effect occurring around the edge of light exiting region ER can be suppressed.

Moreover, the first recess RS1 has a maximum recess depth d1 at the central position C along a direction perpendicular to the surface 100s of the substrate 100 (i.e., the direction Z). The groove G has a maximum groove depth d2 along the direction perpendicular to the surface 100s of the substrate 100 (i.e., the direction Z) and the maximum recess depth d1 is smaller than the maximum groove depth d2. It is worth noting that, in the present embodiment, part of the surface 100s of the substrate 100 is exposed by the grooves G. In other words, two adjacent package structures PS are structurally separated from each other, but the invention is not limited thereto.

It is worth noting that, a depth the first recess RS1 decreases toward all directions away from the central position C. From another point of view, the main body portion MB has a plurality of first inclined surfaces IS1 defining the first recess RS1 along a direction X2 (or a direction Y2) and a plurality of inclined ridges IR defining the grooves G along the direction X2 (or the direction Y2). A connecting site of the first inclined surfaces IS1 defines the central position C of the first recess RS1. Furthermore, a first angle θ1 is included between the first inclined surface IS1 and the surface 100s of the substrate 100 along a direction X2 (or the direction Y2). A second angle θ2 is included between the inclined ridge IR and the surface 100s of the substrate 100 along the direction X2 (or the direction Y2) and the first angle θ1 is smaller than the second angle θ2. In the present embodiment, the first angle θ1 is within a range of 4 degrees to 22 degrees and the second angle θ2 is smaller than 90 degrees, but the invention is not limited thereto. As such, the light LB emitted from one of the light emitting devices 110 can be prevented from being transmitted to another one of the light emitting devices 110 being covered by the same main body portion MB, so as to suppress the halo effect occurring around the edge of light exiting region ER. In some embodiments which are not illustrated, the second angle θ2 may be smaller than 30 degrees.

The main body portion MB further has a plurality of inclined edges IE defining the first recesses RS1 along the direction X1 (or the direction Y1) and a plurality of second inclined surfaces IS2 defining the grooves G along the direction X1 (or the direction Y1). A third angle θ3 is included between the inclined edge IE and the surface 100s of the substrate 100 along the direction X1 (or the direction Y1). A fourth angle θ4 is included between the second inclined surface IS2 and the surface 100s of the substrate 100 along the direction X1 (or the direction Y1). In the present embodiment, the first angle θ1 is larger than the third angle θ3 and the second angle θ2 is smaller than the fourth angle θ4, but the invention is not limited thereto. It is to be particularly mentioned that, the number of the first inclined surface IS1, the second inclined surface IS2, the inclined edge IE and the inclined ridge IR is exemplarily illustrated for the purpose of explanation, and the invention is not limited thereto.

In the following, the simulation results (as shown in FIG. 4, FIG. 5 and FIG. 6) of the light source module 10 and a light source module 50 as a comparative example will be demonstrated. Referring to FIG. 1 and FIG. 7, a difference between the light source module 10 of the present embodiment and the light source module 50 of FIG. 7 lies in: composition of light emitting unit. In comparative example, only one light emitting device 110 is covered by the main body portion MB' of the package structure PS'. In other words, the light emitting unit 200' has only one light emitting device 120. Specifically, the first interval P1' between any two adjacent light emitting units 200' arranged in a direction (for example, the direction X1) is equal to the second interval P2' between any two adjacent light emitting devices 110 arranged in the same direction (for example, the direction X1).

In detail, the main body portion MB' has a central position C', a plurality of inclined edges IE' and a plurality of inclined surfaces IS' surrounding the central position C'. The inclined surfaces IS' are not coplanar with each other. As such, the inclined edge IE' can be defined by two of the inclined surfaces IS'. In addition, a plurality of grooves G' are included between the package structures PS' and the grooves G' are defined by the inclined surfaces IS' of the main body portion MB'. In other words, the package structures PS' of the light emitting units 200' are structurally separated from each other through the arrangement of grooves G'.

It is to be particularly noted that, the luminance of light emitted from the light source module 50 measured along a path I and the luminance of light emitted from the light source module 10 measured along a path that coincides with the section line B-B' are demonstrated in FIG. 4. The luminance of light emitted from the light source module 50 measured along a path II and the luminance of light emitted from the light source module 10 measured along the path II' are demonstrated in FIG. 5. The luminance of light emitted from the light source module 50 measured along a path III and the luminance of light emitted from the light source module 10 along a path that coincides with the section line A-A' are demonstrated in FIG. 6.

Referring to FIG. 4, FIG. 5 and FIG. 6, no significant difference is found between the curve of normalized luminance versus position of the light source module 10 and the curve of normalized luminance versus position of the light source module 50. That means the light source module 10 of present embodiment can offer a light shape being comparable with that of the light source module 50 of comparative example. It is worth noting that, compared to the light source module 50, the main body portion MB (or the package structure PS) of the light source module 10 covers more than one light emitting device 110. Therefore, an occupied volume of the grooves G between the package structures PS of the light source module 10 may less than an occupied volume of the grooves G' between the package structures PS' of the light source module 50, so as to reduce the process difficulty and increase the process margin of the light source module 10. In other words, the manufacturing yield of the light source module 10 can be improved and the manufacturing cost of the light source module 10 can be decreased.

In the following, other embodiments are provided to explain the disclosure in detail, wherein same components will be denoted by the same reference numerals, and the description of the same technical content will be omitted. For the omitted part, please refer to the foregoing embodiment, and the details are not described below. The descriptions regarding the omitted part may be referred to the previous embodiment, and thus will not be repeated herein.

Figure 8:
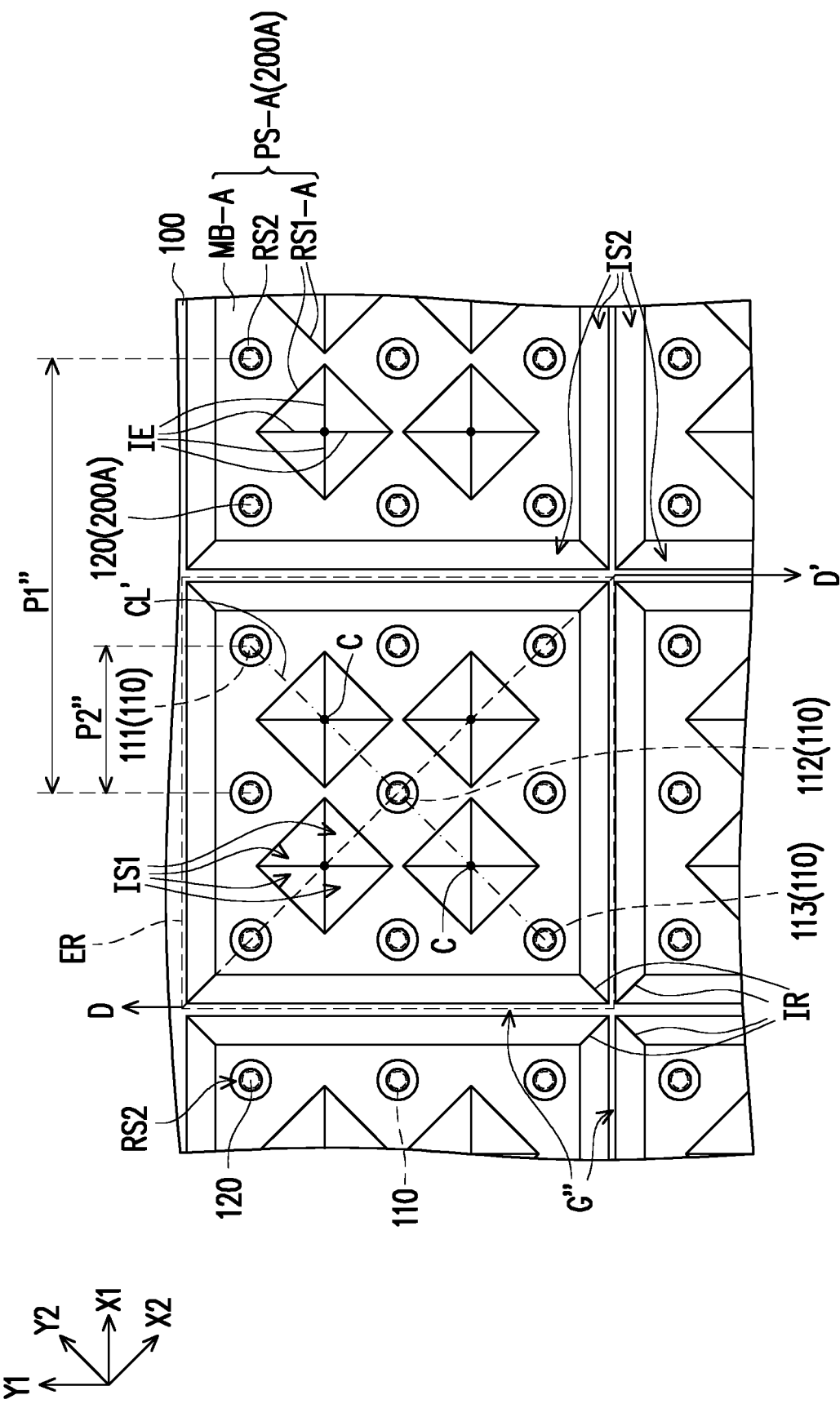
FIG. 8 is a schematic top view of a light source module according to a second embodiment of the invention.
Figure 9:
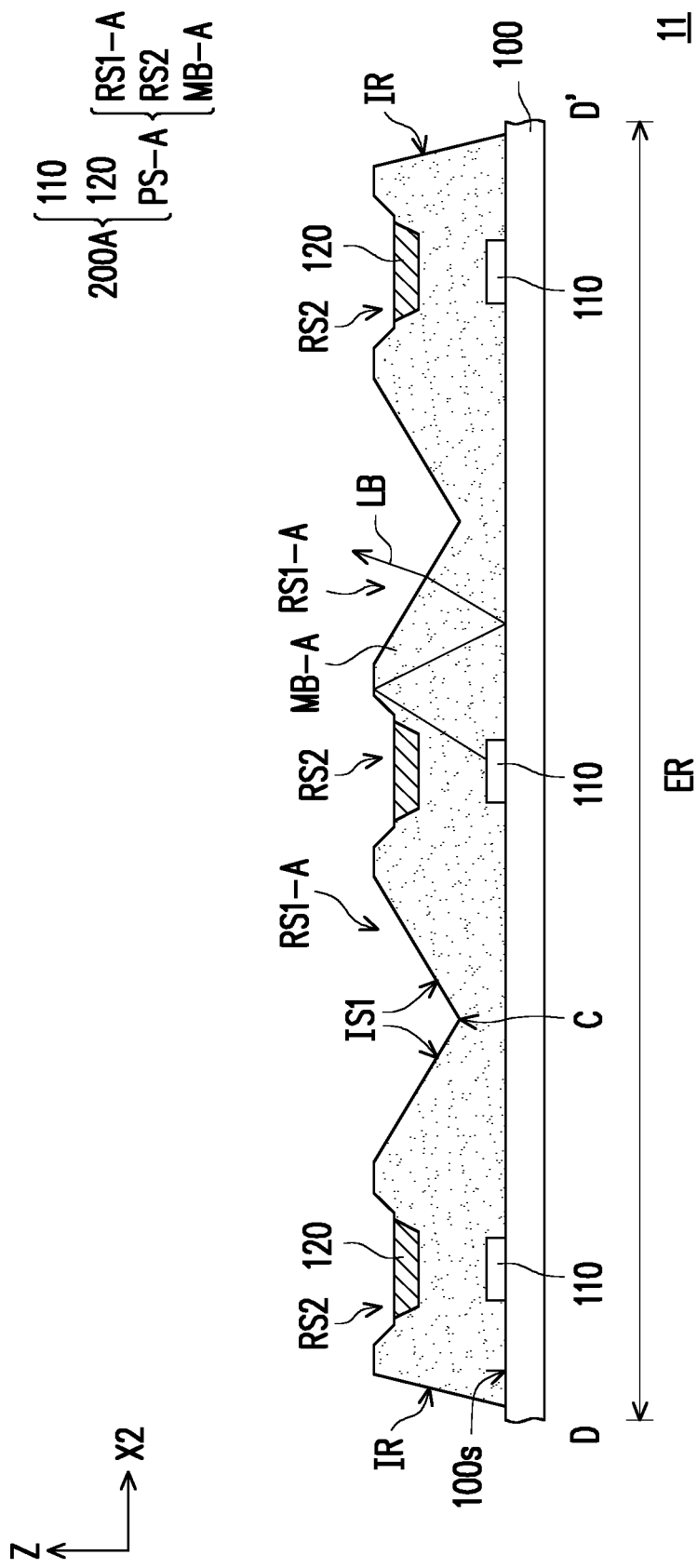
FIG. 9 is a schematic cross-sectional view of a light source module of FIG. 8 corresponding to a section line D-D'.

FIG. 8 is a schematic top view of a light source module according to a second embodiment of the invention. FIG. 9 is a schematic cross-sectional view of a light source module of FIG. 8 corresponding to the section line D-D'.

Referring to FIG. 8 and FIG. 9, a difference between the light source module 11 of the present embodiment and the light source module 10 of FIG. 1 and FIG. 2 lies in: the configuration of package structure. In the present embodiment, nine light emitting devices 110 are covered by the main body portion MB-A of the package structure PS-A and four first recesses RS1-A of the main body portion MB-A are included in the light emitting unit 200A. Specifically, the first recess RS1-A and the light emitting device 110 are alternately arranged in the direction X1, the direction X2, the direction Y1 and the direction Y2. As such, the light LB emitted from one of the light emitting devices 110 can be prevented from being transmitted to another one of the light emitting devices 110 being covered by the same main body portion MB-A, so as to suppress the halo effect occurring around the edge of light exiting region ER.

For example, a first light emitting device 111, a second light emitting device 112, a third light emitting device 113 and two first recesses RS1-A are arranged in the direction Y2. One of the first recesses RS1-A is positioned between the first light emitting device 111 and the second light emitting device 112. The other of the first recesses RS1-A is positioned between the second light emitting device 112 and the third light emitting device 113. A connecting line CL' of orthogonal projections of the first light emitting device 111 and the third light emitting device 113 on the surface 100s of the substrate 100 passes through orthogonal projections of central positions C of both the first recesses RS1-A and the second light emitting device 112 on the surface 100s of the substrate 100.

It is worth noting that, compared to the light source module 10, the main body portion MB-A (or the package structure PS-A) of the light source module 11 covers more than four light emitting device 110. Therefore, an occupied volume of the grooves G" between the package structures PS-A of the light source module 11 may less than an occupied volume of the grooves G between the package structures PS of the light source module 10, so as to reduce the process difficulty and increase the process margin of the light source module 11. In other words, the manufacturing yield of the light source module 11 can be improved and the manufacturing cost of the light source module 11 can be decreased.

In the present embodiment, the first interval P1" between any two adjacent light emitting unit 200A arranged in a direction (for example, the direction X1) may be three times the second interval P2" between any two adjacent light emitting devices 110 arranged in the same direction (for example, the direction X1), but the invention is not limited thereto. Moreover, the orthogonal projections of these four first recesses RS1-A and the grooves G on the surface 100s of the substrate 100 are separated from each other. However, the invention is not limited thereto. In some embodiments, the orthogonal projections of four first recesses on the surface 100s of the substrate 100 may be connected to each other.

Figure 10:
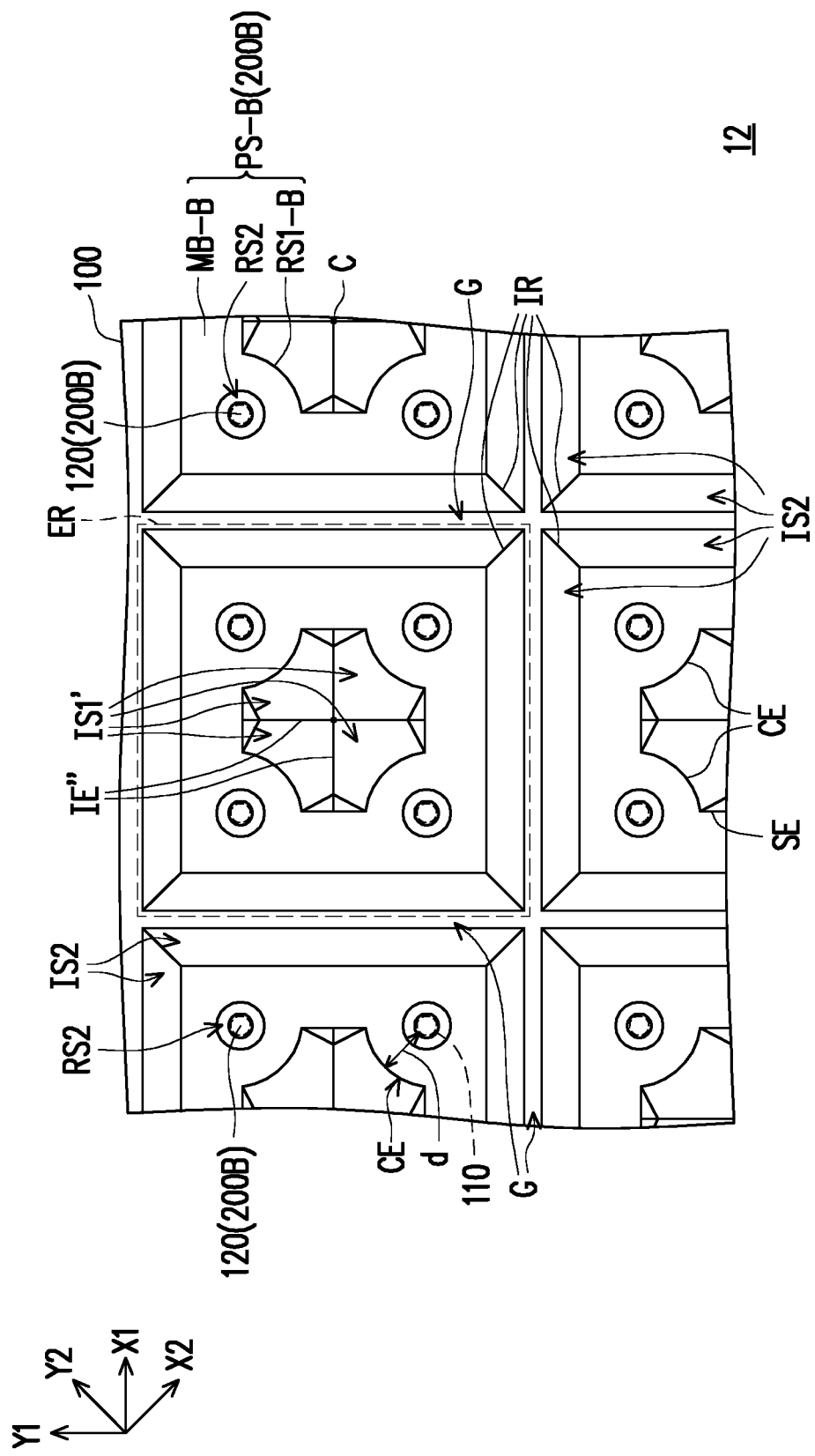
FIG. 10 is a schematic top view of a light source module according to a third embodiment of the invention.

FIG. 10 is a schematic top view of a light source module according to a third embodiment of the invention. Referring to FIG. 10, a difference between the light source module 12 of the present embodiment and the light source module 10 of FIG. 1 and FIG. 2 lies in: the configuration of the first recess. In the present embodiment, the main body portion MB-B of the package structure PS-B of the light emitting unit 200B further includes a plurality of curved edges CE and a plurality of straight edges SE defining an opening of the first recess RS1-B. The curved edge CE and the straight edge SE are alternately connected around the central position C of the first recess RS1-B. Specifically, the inclined surface IS1' is mainly defined by the curved edge CE and the two inclined edge IE" opposite to the curved edge CE. It is worth noting that, a distance d between any point on the curved edge CE and the adjacent light emitting device 110 is the same. As such, the uniformity of the light output of the light source module 12 can be improved.

Figure 11:
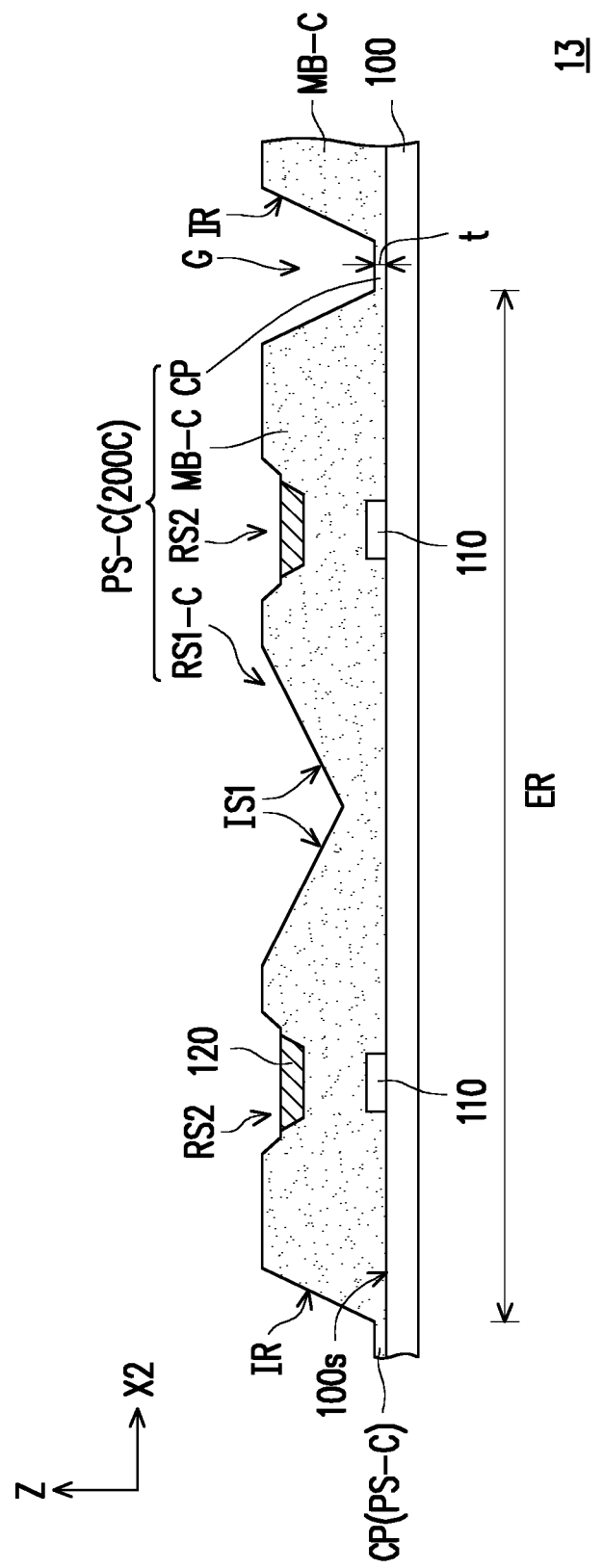
FIG. 11 is a schematic cross-sectional view of a light source module according to a fourth embodiment of the invention.

FIG. 11 is a schematic cross-sectional view of a light source module according to a fourth embodiment of the invention. Referring to FIG. 11, a difference between the light source module 13 of the present embodiment and the light source module 10 of FIG. 2 lies in: the composition of the package structure. Specifically, the package structure PS-C of the light emitting unit 200C further includes a plurality of connecting portions CP. The connecting portions CP are overlapped with the grooves G along a direction perpendicular to the surface 100s of the substrate 100 (i.e., the direction Z). The connecting portions CP are connected between the main body portions MB. In the present embodiment, a thickness t of the connecting portion CP along the direction perpendicular to the surface 100s of the substrate 100 (i.e., the direction Z) is within a range of 0.1 cm to 0.4 cm. In other embodiment, a maximum thickness of the main body MB-C along the direction perpendicular to the surface 100s of the substrate 100 (i.e., the direction Z) is larger than three times of the thickness t of the connecting portion CP along the direction perpendicular to the surface 100s of the substrate 100 (i.e., the direction Z) but the invention is not limited thereto. It is worth mentioning that, the process margin of the light source module 13 can be increased through the arrangement of the connecting portion CP.

In summary, in the light source module according to an embodiment of the invention, a package structure of a light emitting unit is disposed between light emitting devices and reflective elements. At least two light emitting devices are covered by a main body portion of the package structure so that the manufacturing tolerance of the package structures can be increased. In addition, a first recess of the package structure having a central position is positioned between the light emitting devices and its depth decreases toward all directions away from the central position. Accordingly, the light emitted by a light emitting device can be prevented from being transmitted laterally from a predetermined light exiting region to another light exiting region overlapped with another package structure so as to inhibit the halo effect occurring around the edge of light exiting region. In other words, the uniformity of the light output of the light source module can be improved.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light source module, comprising:
   a substrate;
   a plurality of light emitting units disposed on a surface of the substrate, and each light emitting unit comprising:
      a first light emitting device and a second light emitting device;
      a first reflective element and a second reflective element, respectively overlapped with the first light emitting device and the second light emitting device along a direction being perpendicular to the surface of the substrate; and
      a package structure, disposed between the first reflective element, the second reflective element, the first light emitting device and the second light emitting device, wherein the package structure comprises a main body portion and a first recess, the main body portion covers the first light emitting device and the second light emitting device, the main body portion has a plurality of first inclined surfaces defining the first recess, a first angle is included between the first inclined surface and the surface of the substrate along a first direction, the first angle is within a range of 4 degrees to 22 degrees, the first recess has a central position, and a depth of the first recess decreases toward all directions away from the central position; and
   a plurality of grooves, disposed between the package structures of the light emitting units, wherein an orthogonal projection of the first recess on the surface of the substrate is separated from an orthogonal projection of the grooves on the surface of the substrate, the main body portion further has a plurality of inclined ridges defining the grooves along the first direction, a second angle is included between the inclined ridge and the surface of the substrate, and the first angle is smaller than the second angle.

2. The light source module as claimed in claim 1, wherein a connecting site of the first inclined surfaces defines the central position of the first recess.

3. The light source module as claimed in claim 1, wherein the second angle is smaller than 30 degrees.

4. The light source module as claimed in claim 1, wherein the main body portion further has a plurality of inclined edges defining the first recess along a second direction and a plurality of second inclined surfaces defining the grooves along the second direction, the first direction and the second direction intersect each other, a third angle is included between the inclined edge and the surface of the substrate, and a fourth angle is included between the second inclined surface and the surface of the substrate, wherein the first angle is larger than the third angle, and the second angle is smaller than the fourth angle.

5. The light source module as claimed in claim 1, wherein the first recess has a maximum recess depth at the central position along a direction perpendicular to the surface of the substrate, the groove has a maximum groove depth along the direction perpendicular to the surface of the substrate, and the maximum recess depth is smaller than the maximum groove depth.

6. The light source module as claimed in claim 1, wherein a distance between two orthogonal projections of the first light emitting device and the central position of the first recess on the surface of the substrate is equal to a distance between two orthogonal projections of the second light emitting device and the central position of the first recess on the surface of the substrate.

7. The light source module as claimed in claim 1, wherein the first recess is not overlapped with the first light emitting device, the second light emitting device, the first reflective element, and the second reflective element along a direction perpendicular to the surface of the substrate.

8. The light source module as claimed in claim 1, wherein the first light emitting device and the second light emitting device are respectively disposed on two opposite sides of the first recess, and a connecting line of two orthogonal projections of the first light emitting device and the second light emitting device on the surface of the substrate passes through an orthogonal projection of the central position of the first recess on the surface of the substrate.

9. The light source module as claimed in claim 1, wherein the package structure further comprises two second recesses, respectively overlapped with the first light emitting device and the second light emitting device along a direction perpendicular to the surface of the substrate, and the first reflective element and the second reflective element are respectively disposed in the second recesses.

10. The light source module as claimed in claim 1, wherein the package structure further comprises a plurality of connecting portions, and the connecting portions are overlapped with the grooves along a direction perpendicular to the surface of the substrate, wherein the connecting portions of the package structures of the light emitting units are connected between the main body portions, and a maximum thickness of the main body along the direction perpendicular to the surface of the substrate is larger than three times of a thickness of the connecting portion along the direction perpendicular to the surface of the substrate.

11. The light source module as claimed in claim 1, wherein each light emitting unit further comprises a third light emitting device, the package structure further comprises another first recess, and the first recesses are respectively positioned between the first light emitting device, the second light emitting device and the third light emitting device.

12. The light source module as claimed in claim 11, wherein one of the first recesses is positioned between the first light emitting device and the second light emitting device, the other of the first recesses is positioned between the second light emitting device and the third light emitting device, and a connecting line of orthogonal projections of the first light emitting device and the third light emitting device on the surface of the substrate passes through orthogonal projections of the central positions of the first recesses on the surface of the substrate.

13. A light source module, comprising:
a substrate; and
a plurality of light emitting units disposed on a surface of the substrate, and each light emitting unit comprising:
  a first light emitting device and a second light emitting device;
  a first reflective element and a second reflective element, respectively overlapped with the first light emitting device and the second light emitting device along a direction being perpendicular to the surface of the substrate; and
  a package structure, disposed between the first reflective element, the second reflective element, the first light emitting device and the second light emitting device, wherein the package structure comprises a main body portion and a first recess, and the main body portion covers the first light emitting device and the second light emitting device, the first recess has a central position, and a depth of the first recess decreases toward all directions away from the central position,
wherein the light emitting units are arranged with a first interval along a first direction, the first light emitting devices and the second light emitting devices of the light emitting units are arranged with a second interval along the first direction, and a ratio of the first interval to the second interval is an integer being larger than 1.

* * * * *